United States Patent [19]
Brady

[11] Patent Number: 6,157,578
[45] Date of Patent: Dec. 5, 2000

[54] METHOD AND APPARATUS FOR ACCESSING A MEMORY DEVICE

[75] Inventor: James Brady, Plano, Tex.

[73] Assignee: STMicroelectronics, Inc., Carrollton, Tex.

[21] Appl. No.: 09/354,398

[22] Filed: Jul. 15, 1999

[51] Int. Cl.[7] .................................................. G11C 7/00
[52] U.S. Cl. ..................... 365/189.05; 365/207; 365/220
[58] Field of Search ............................. 365/189.01, 205, 365/207, 189.05, 220, 238.5

[56] References Cited

U.S. PATENT DOCUMENTS

| | | | |
|---|---|---|---|
| 4,804,871 | 2/1989 | Waqlters, Jr. ............................... | 327/54 |
| 4,931,994 | 6/1990 | Matsui et al. ....................... | 365/189.01 |
| 5,127,739 | 7/1992 | Duvvury et al. .................... | 365/189.11 |
| 5,241,503 | 8/1993 | Cheng ...................................... | 365/205 |
| 5,706,229 | 1/1998 | Yabe et al. .......................... | 365/189.05 |
| 5,881,006 | 3/1999 | Yabe et al. ................................ | 365/207 |

*Primary Examiner*—David Nelms
*Assistant Examiner*—Gene N. Auduong

*Attorney, Agent, or Firm*—Theodore E. Galanthay; Lisa K. Jorgenson; Andre Szuwalski

[57] ABSTRACT

A device and method for accessing a row of data in a semiconductor memory device in a single operation is disclosed. The device includes a row of latches having a width which matches the width of the memory array in the semiconductor memory device. The device includes precharge and equilibration circuitry associated with the row of latches and the row of sense amplifiers in device, and timing circuitry for controlling the operation of each in performing full page read and write operations. Writing a full row of data from the row of latches into a selected row of memory cells includes the steps of disconnecting the row of sense amplifiers from the reference voltage sources; equalizing voltage levels appearing on the bit lines of the semiconductor memory and the sense amplifiers; connecting a row of memory cells to the bit lines; driving at least one bit line of each pair of bit lines to a voltage level representing the data value stored in the corresponding latch; coupling the sense amplifiers to the reference voltage sources for powering the sense amplifiers; and disconnecting the row of memory cells from the bit lines.

17 Claims, 4 Drawing Sheets

METHOD AND APPARATUS FOR ACCESSING A MEMORY DEVICE

BACKGROUND OF THE INVENTION

1. Technical Field of the Invention

The present invention relates to a device and method for accessing a semiconductor memory device, and particularly to a method for reading and writing a full page of data into a random access memory (RAM) device in a single memory cycle.

2. Background of the Invention

Conventional dynamic random access memory (DRAM) devices employ a single transistor architecture wherein the memory cell comprises a storage capacitor having a first terminal connected to a reference voltage and a second terminal connected to a pass gate transistor. The core of the DRAM is typically partitioned into arrays or blocks of memory cells, with each array including a plurality of rows of memory cells, wherein the memory cells in each row are connected to a respective one of a plurality of word lines. Memory cells in each column of cells in a memory array are connected to a respective one of a plurality of bit lines.

Existing DRAM devices typically utilize column decode circuitry so that only a relatively small block of data, such as a byte or word of data, is read from and written into a DRAM array during a single memory cycle. Reading or writing a relatively large block of data, such as a page of data, to a DRAM device in this fashion, however, is inefficient and even prohibitive for certain higher speed applications. Consequently, there is a need to more efficiently access DRAM devices with relatively large blocks of data.

SUMMARY OF THE INVENTION

The present invention overcomes shortcomings in prior and existing memory devices and satisfies a significant need for a semiconductor memory device that allows for the quick and accurate access thereof in relatively large blocks of data. The present invention is directed to a semiconductor memory device, such as a DRAM device, including at least one memory array of memory cells arranged in a plurality of rows of memory cells, with the memory cells in each row being coupled to a distinct word line and the memory cells in each column being coupled to a distinct bit line. The present invention further includes a row of sense amplifier elements coupled to the bit lines of the memory array, and a row of latch elements operatively coupled to the bit lines of the memory array. The latch elements are operatively connected to the bit lines in order for an entire page or row of data to be written into or read from the memory array in a single memory access cycle. The present invention further includes control circuitry for controlling the connection between the latch elements and the bit lines as well as between the reference voltage sources and the sense amplifier elements in order to avoid having a latch element and corresponding sense amplifier element drive the bit line associated therewith towards opposite voltage sources.

Writing data into an entire row of memory cells in the memory array begins by precharging and equalizing the bit lines and the sense amplifier elements. During the precharging and equalizing step, the sense amplifier elements are turned off by isolating the sense amplifier elements from the reference voltage sources, Vss and Vdd. Shortly thereafter, the selected row of memory cells is connected to the bit lines by the signal appearing on the word line of the selected row being asserted. At approximately the same time, the latch elements are electrically connected to the bit lines so as to drive the bit lines towards voltage levels corresponding to the binary data stored in the latch elements. Next, the sense amplifier elements are powered up in the correct state by connecting the sense amplifier elements to the reference voltage sources. Once powered up, the sense amplifier elements facilitate the driving of the bit lines to the appropriate reference voltage levels. The full page write operation is then completed by de-asserting the previously asserted signal appearing on the selected word line.

BRIEF DESCRIPTION OF THE DRAWINGS

A more complete understanding of the present invention may be had by reference to the following detailed description when taken in conjunction with the accompanying drawings wherein.

DETAILED DESCRIPTION OF THE PREFERRED EMBODIMENTS

Figure 1:
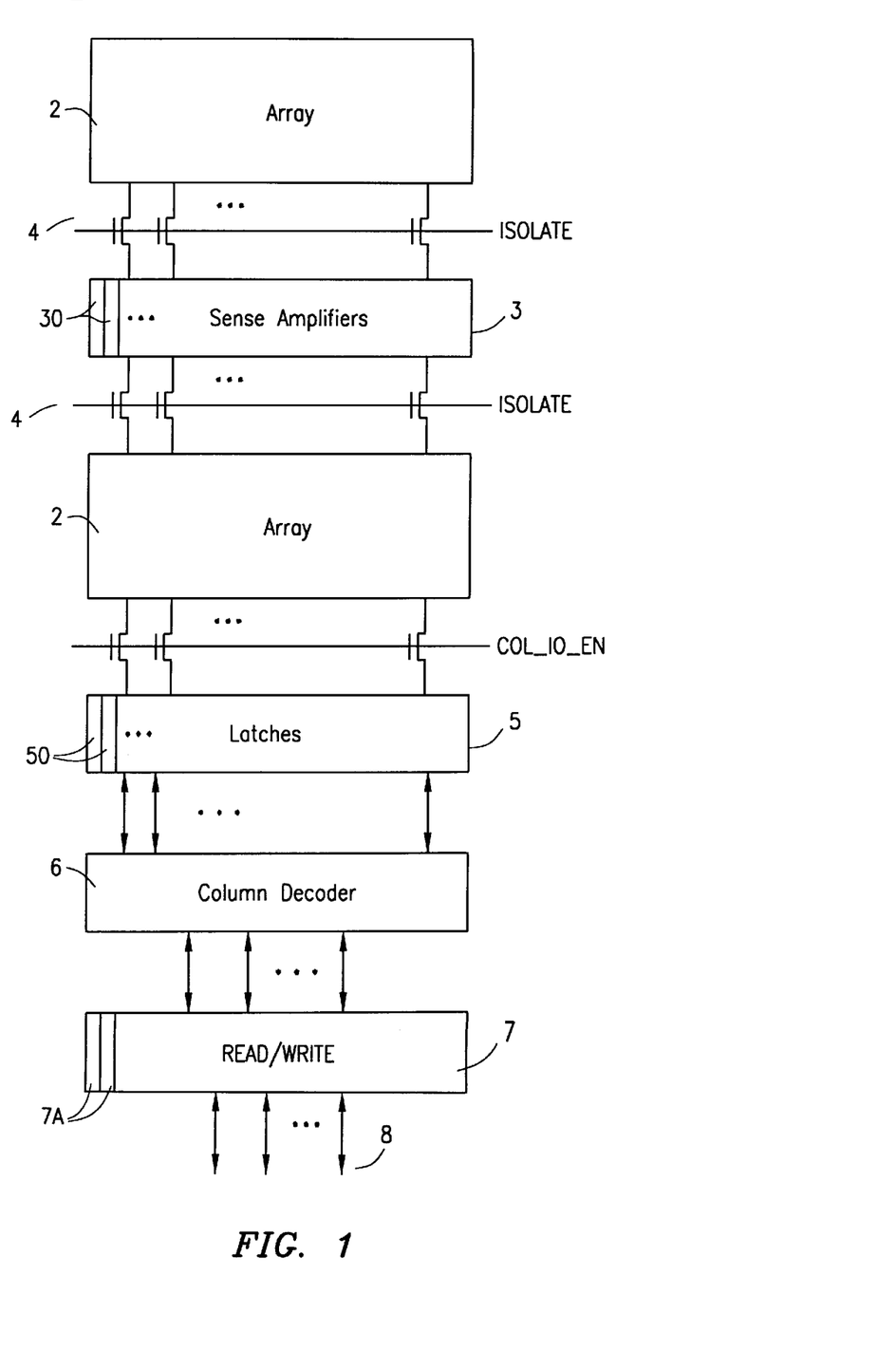
FIG. 1 is a block diagram of a random access memory device according to the present invention.
Figure 2:
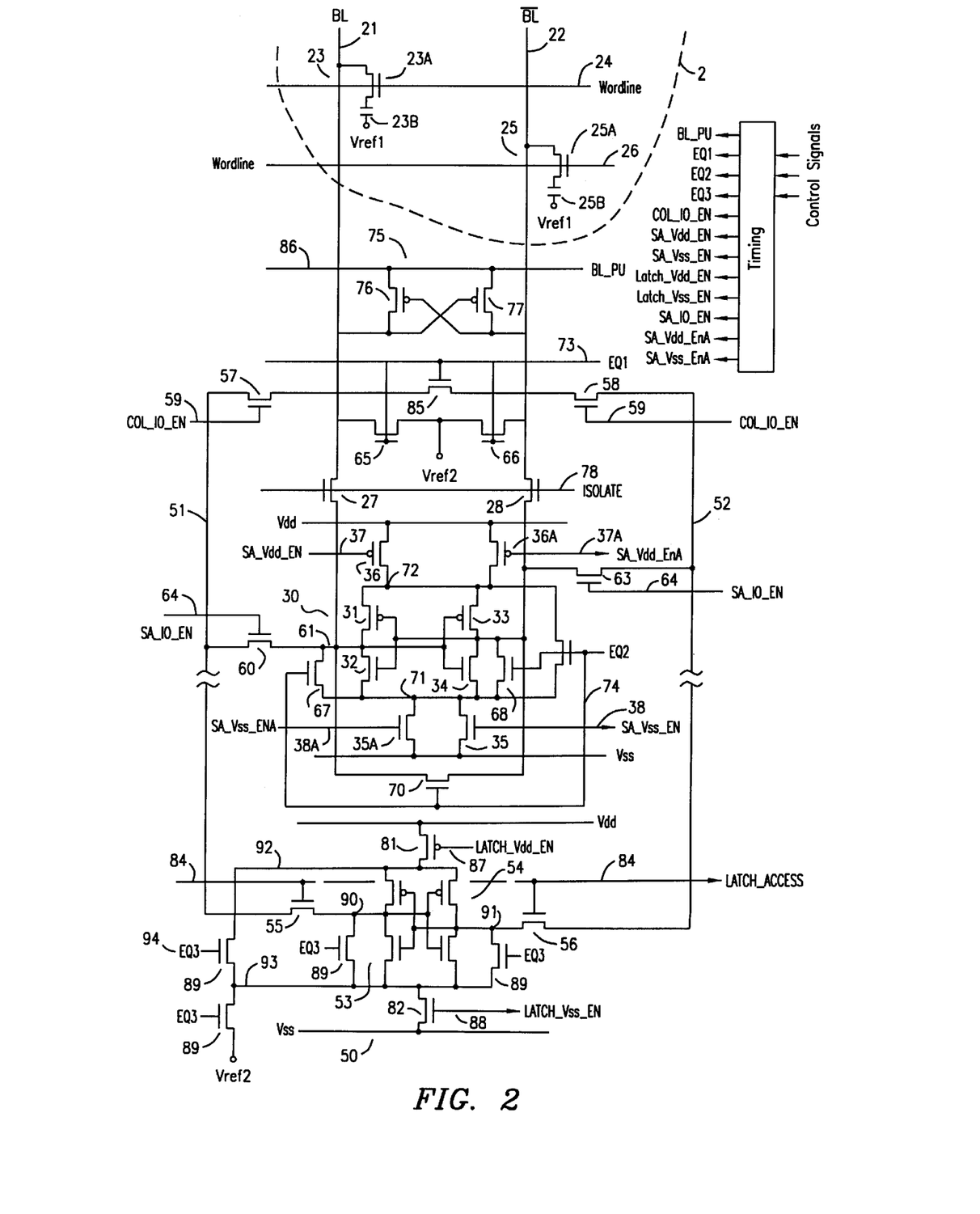
FIG. 2 is a schematic diagram of a portion of the random access memory device shown in FIG. 1.

Referring to FIGS. 1–2, there is shown a dynamic random access memory (DRAM) device 1 according to the preferred embodiment of the present invention. The DRAM device 1 includes at least one memory cell array 2 organized as a plurality of rows of memory cells with the memory cells in each row connected to a respective one of a plurality of word lines. Memory cells in each column in memory cell array 2 are connected to a respective one of a plurality of bit lines. The DRAM device 1 is illustrated in FIG. 1 as including two memory cell arrays 2 for exemplary purposes only. It is understood that the DRAM device 1 may include virtually any number of memory cell arrays 2.

The DRAM device 1 further includes a row 3 of sense amplifiers 30, with each sense amplifier 30 connected to a pair of bit lines of memory cell array 2 (FIG. 2). Each sense amplifier 30 senses the small change in charge appearing on the bit line pair associated therewith and drives each bit line of the bit line pair to the appropriate full reference voltage level, such as Vdd or Vss. Sense amplifiers 30 are utilized in performing memory read, write and refresh operations, as explained below. A row 4 of isolation transmission gates are disposed between the row 3 of sense amplifiers 30 and each memory cell array 2 in part to limit the capacitive load during a memory operation.

A row 5 of latch elements 50 is included in DRAM device 1 to store data for writing into a memory cell array 2 and/or for reading data therefrom. There is preferably a latch element 50 coupled to each bit line pair in memory cell array 2 so that data may be written into or read from an entire row of memory cells in memory cell array 2 during a single memory cycle. It is understood that other storage devices may be utilized instead of the row 5 of latch elements 50, such as a row 5 of flip flop elements.

Column decode circuitry 6 and read/write circuitry 7 are included in DRAM device 1 to facilitate the concurrent uploading and/or downloading of data between latch elements 50 and the external I/O of DRAM device 1 in smaller blocks of data, such as a byte of data. Column decode circuitry 6 may form a multiplexer array controlled by column address signals (not shown). A read/write circuit 7A exists for each external I/O pin of DRAM device 1. It is understood that the particular number of data bits in the block of data, and hence the number of read/write circuits 7A, may vary depending upon the particular application in which DRAM device 1 is utilized.

FIG. 2 illustrates the structural relationship between a portion of memory array 2, sense amplifiers 30 and latches 50 of DRAM device 1 corresponding to a single pair of bit lines 21 and 22 of memory array 2. It is understood that the circuitry shown in FIG. 2 is replicated for each pair of bit lines in memory array 2.

Memory cell 23 of memory array 2 includes transmission gate 23A having a gate terminal thereof connected to wordline 24, and capacitor 23B having a first plate connected to transmission gate 23A and a second plate connected to a first reference voltage Vref1. As can be seen, capacitor 23B is connected to bit line 21 when the row access signal appearing on wordline 24 is asserted (i.e., driven to a logic high voltage to turn on transmission gate 23A).

Similarly, memory cell 25 of memory array 2 includes transmission gate 25A having a gate terminal thereof connected to wordline 26, and capacitor 25B having a first plate connected to transmission gate 25A and a second plate connected to first reference voltage Vref1. As can be seen, capacitor 25B is connected to bit line 22 when the row access signal appearing on wordline 26 is asserted (i.e., driven to a logic high voltage to turn on transmission gate 25A).

Sense amplifier is coupled to bit lines 21 and 22 through isolation transmission gates 27 and 28, respectively. Sense amplifier 30 preferably is a latch formed from two cross-coupled inverters. A first inverter is formed by pull-up transistor 31 and pull-down transistor 32 and drives bit line 21 (via isolation transmission gate 27). A second inverter is formed by pull-up transistor 33 and pull-down transistor 34 and drives bit line 22 (via isolation transmission gate 28). Although FIG. 2 shows pull-up transistors 31 and 33 as p-channel MOS transistors and pull-down transistors 32 and 34 as n-channel MOS transistors, it is understood that sense amplifier 30 may utilize other types of transistors.

Sense amplifier 30 is a gated device, having pull-down transistors 32 and 34 connected to Vss via n-channel transmission gates 35 and 35A and pull-up transistors 31 and 33 connected to Vdd via p-channel transmission gates 36 and 36A. Transmission gate 35 has a lower drive strength than the drive strength of transmission gate 35A for reasons explained below. Likewise, transmission gate 36 has a lower drive strength than the drive strength of transmission gate 36A. Sense amplifier 30 is thus powered up upon the assertion of signals SA_Vdd_En and SA_Vdd_EnA (connected to the gate terminal of transmission gates 36 and 36A, respectively) as well as signals SA_Vss_En and SA_Vss_EnA (connected to the gate terminal of transmission gates 35 and 35A, respectively).

Latch 50 from the row 5 of latches 50 is coupled to column input/output (I/O) lines 51 and 52. Column I/O lines 51 and 52 are utilized to transport data between latch 50 and bit lines 21 and 22. Latch 50 includes cross-coupled inverters 53 and 54 which drive column I/O lines 51 and 52, respectively. Latch 50 drives column I/O lines 51 and 52 via transmission gates 55 and 56, respectively. Transmission gates 55 and 56 are activated upon the assertion of the signal Latch_Access appearing on control line 84. Latch 50 may also drive a second set of column I/O lines corresponding to another memory array via a second pair of transmission gates (not shown).

Latch 50 is a gated device, having pull-down transistors connected to Vdd via transmission gate transistor 81 and pull-down transistors connected to Vss via transmission gate transistor 82. Latch 50 is thus powered up upon the assertion of signal Latch_Vdd_En 87 (connected to the gate terminal of transistor 81) and signal Latch_Vss_En 88 (connected to the gate terminal of transistor 82). Control signals Latch_Vdd_En 87 and Latch_Vss_En 88 are decoded in blocks corresponding to the width of external data I/O lines 8 (FIG. 1) by decode control circuitry (not shown), in order to execute a conventional memory read or write operation. This decode control circuitry is bypassed when reading from or writing to a full row of memory cells in a single memory cycle.

The present invention further includes coupling between column I/O lines 51, 52 and bit lines 21, 22, respectively. In particular, transmission gate 57 is connected between column I/O line 51 and bit line 21, and transmission gate 58 is connected between column I/O line 52 and bit line 22. The gate terminals of transmission gates 57 and 58 are connected to control line 59 so that a control signal Col_IO_En appearing thereon selectively controls the electrical connection between column I/O lines 51 and 52 and bit lines 21 and 22, respectively.

Further, the present invention may include coupling between column I/O lines 51, 52 and the input/output terminals of sense amplifier 30. Transmission gate 60 is connected between column I/O line 51 and a first I/O terminal 61 of sense amplifier 30. Column I/O line 52 is connected to a second I/O terminal 62 of sense amplifier 30 via transmission gate 63. A control line 64 is connected to the gate terminals of transmission gates 60 and 63 so that a control signal SA_IO_En appearing thereon selectively controls the electrical connection between sense amplifier 30 and column I/O lines 51 and 52.

In accordance with a preferred embodiment of the present invention, DRAM device 1 includes precharge and equilibrate circuitry for setting an initial state of bit lines 21 and 22, sense amplifier 30 and latch 50 prior to the execution of a memory read or write operation. With regard to bit lines 21 and 22, such circuitry includes equilibrate transmission gate 85 which is connected between bit lines 21 and 22 so as to short bit lines 21 and 22 together when activated. In addition, precharge transmission gates 65 and 66 electrically connect bit lines 21 and 22, respectively, to a precharge reference voltage Vref2 when activated. A control line 73 is connected to the gate terminal of equilibrate transmission gate 64 and precharge transmission gates 65 and 66 so that a control signal EQ1 appearing thereon controls the initialization of bit lines 21 and 22.

Moreover, sense amplifier 30 includes equilibrate transmission gates 67–70 which, when activated, electrically short together first sense amplifier I/O terminal 61, second sense amplifier I/O terminal 62, and internal nodes 71 and 72 of sense amplifier 30. A control line 74 is connected to the gate terminals of equilibrate transmission gates 67–70 so that a control signal EQ2 placed on control line 74 controls the initialization of sense amplifier 30.

Latch 50 includes equilibrate transmission gates 89 which, when activated, electrically short together nodes 90–93 that are internal to latch 50 and reference voltage Vref2. A control line 94 is connected to the gate terminals of equilibrate transmission gates 89 so that a control signal EQ3 appearing on control line 94 controls the initialization of latch 50.

The present invention further includes bit line recovery circuitry 75, including cross-coupled pull-up transistors 76 and 77. Pull-up transistor 76 has a drain terminal connected to bit line 21 and a gate terminal connected to bit line 22. Pull-up transistor 77 has a drain terminal connected to bit line 22 and a gate terminal connected to bit line 21. The source terminals of pull-up transistors 76 and 77 are connected to control line 86. In this way, when control line 86 is driven to Vdd, the pull-up transistor 76 or 77 having its drain terminal connected to the bit line 21 or 22 driven towards Vdd will be turned on so as to pull the bit line 21 or 22 more quickly to Vdd. In a preferred embodiment of the present invention, pull-up transistors 76 and 77 are p-channel MOS transistors.

The present invention further includes timing circuitry 80 which provides control signals for controlling control lines 37–38, 59, 64, 73–74, 84, 86–88 and 94. Timing circuitry 80 may preferably have as its input(s) both internal and external timing/control signals for DRAM device 1 which are typically utilized to control the sequence of events in performing conventional read, write and refresh operations.

Figure 3:
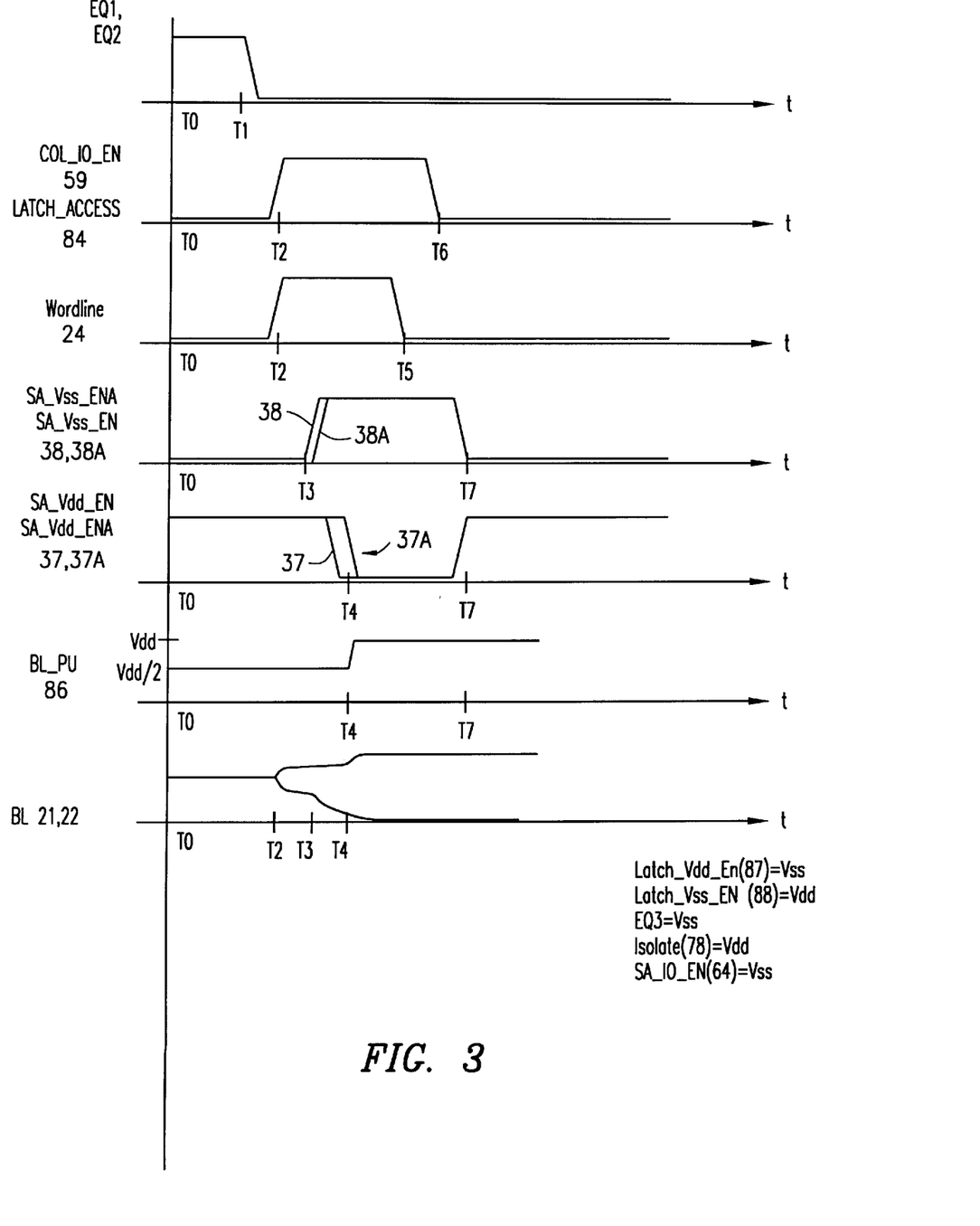
FIG. 3 is a timing diagram illustrating a full page write operation according to the present invention.

The operation of the present invention in writing data from the row 5 of latches 50 into an entire row of memory cells in memory array 2 during a single memory access cycle (i.e., a full page write operation) will be described with reference to the timing diagram of FIG. 3. Initially, it is noted that, with respect to a full page write operation, because each memory cell in a selected row is being written with new data from a latch 50, there is no need to execute a read/refresh operation prior to writing data into the row of memory cells. Moreover, because the writing of data into the memory cells of the selected row of memory cells is the same for each memory cell, the full page write operation will be described in terms of writing data into a single memory cell in the selected row of memory cells. In the example presented below, the memory cells coupled to wordline 24 are the selected memory cells into which a full page of data is to be written.

At time T0, timing circuitry 80 asserts control signals EQ1 and EQ2 appearing on control lines 73 and 74, respectively, which precharge and equilibrate the bit lines 21 and 22 and sense amplifier 30. At this point, bit lines 21 and 22 are shorted together and precharged to reference voltage Vref1. Control line 86 (BL_PU) is preferably driven to an intermediate voltage level, such as Vref1, at this time. In addition, nodes within sense amplifier 30 are shorted together. Although in this example control line 78 (Isolate) is driven to Vdd throughout the write operation so as to couple sense amplifier 30 to bit lines 21 and 22, it is understood that control line 78 may be initially driven to Vss to decouple sense amplifier 30 from bit lines 21 and 22. Timing circuitry 80 drives control line 38 to Vss and control line 37 to Vdd at time To in order to maintain sense amplifier 30 decoupled from Vdd and Vss. At this point, sense amplifier 30 is not powered up.

The precharging and equilibrating of bit lines 21 and 22 and sense amplifier 30 are completed at time T1 with the control signals EQ1 and EQ2 being de-asserted. Next, wordline 24 and control line 84 (Latch_Access) are driven towards Vdd at time T2 in order to connect memory cell 23 to bit line 21 and to connect latch 50 to column I/O lines 51 and 52, respectively. At approximately the same time, timing circuitry 80 drives either control line 59 (Col_IO_En) or control line 64 (SA_IO_En) towards Vdd, which turns on transmission gate pair 57, 58 or transmission gate pair 60, 63, respectively. As a result, bit lines 21 and 22 as well as memory cell 23 are connected to latch 50. Because the outputs of latch 50 (being driven to Vdd and Vss) provide a greater drive strength than the charge initially appearing on memory cell capacitor 23B as well as the charge appearing on bit line 21, memory cell capacitor 23B and bit line 21 are driven towards the voltage level corresponding to the data stored in latch 50. In this example, bit line 21 and memory cell 23 are driven towards Vdd and bit line 22 is driven towards Vss, so that a voltage differential exists between bit lines 21 and 22 following time T2.

It is understood that latch 50 may be connected to bit lines 21 and 22 by driving control line 64 (SA_IO_En) to Vdd at time T2 instead of driving control line 59 (Col_IO_En) as described above.

Next, sense amplifier 30 is powered up by timing circuitry 80 driving control lines 38 (SA_Vss_En) and 38A (SA_Vss_EnA) to Vdd at time T3 in order to provide Vss to sense amplifier 30. Shortly after time T3, timing circuitry 80 drives controls line 37 (SA_Vdd_En) and 37A (SA_Vdd_EnA) to Vss at time T4 in order to provide Vdd to sense amplifier 30. Delaying the connecting of Vdd to sense amplifier 30 relative to connecting Vss thereto substantially reduces noise associated with turning on sense amplifiers 30 in DRAM device 1.

In order to further reduce noise within DRAM device 1 during the powering up of sense amplifiers 30, the driving of control lines 38 and 38A are staggered in time relative to each other. In particular, control line 38 is asserted slightly before control line 38A is asserted. In this way, transmission gate 35 is turned on before transmission gate 35A (having a greater drive strength than the drive strength of transmission gate 35). This staggering of the time transmission gates 35 and 35A are turned on reduces noise generation during the time sense amplifiers 30 begin to sense charge differentials appearing on corresponding bit lines 21 and 22. Similarly, control line 37 is asserted just before control line 37A is asserted, in order to turn on transmission gate 36 (having the lower drive strength) before turning on transmission gate 36A.

It is understood that control lines 37, 37A, 38 and 38A may alternatively be driven at substantially the same time.

Next, sense amplifier 30, being connected to Vss and Vdd and powered up, senses the voltage differential appearing between bit lines 21 and 22 and drives bit lines 21 and 22 towards Vss and Vdd based upon the polarity of the voltage differential between bit lines 21 and 22. In this case, bit line 21 is driven towards Vdd and bit line 22 towards Vss. It is noted that sense amplifier 30 is utilized during the present full page write operation in order to avoid excess charge buildup on bit lines 21 and 22 and/or sense amplifier 30 which may have an adverse effect in subsequent memory access operations.

Control line 86 (BL_PU) is driven to Vdd at time T4, which enables pull-up device 76 since the gate terminal thereof is driven towards Vss. Consequently, bit line 21 is pulled towards Vdd by pull-up device 76 in addition to being pulled by sense amplifier 30.

Once bit lines 21 and 22 are provided sufficient time to substantially reach Vdd and Vss, respectively, word line 24 is driven to Vss at time T5 in order to turn off memory cell transistor 23A and disconnect memory capacitor 23B from bit line 21. At this point, the data value (a logic high value) stored in latch 50 has been stored in memory cell 23. Once the signal appearing on word line 24 is de-asserted, timing circuitry 80 drives control line 59 (Col_IO_En) or control line 64 (SA_IO_EN) to Vss at time T6 to disconnect column I/O lines 51 and 52 from bit lines 21 and 22, respectively; drives control line 84 (Latch_Access) to Vss at time T6 to disconnect latch 50 from column I/O lines 51 and 52; and controls control lines 37, 37A, 38 and 38A to turn off sense amplifier 30 at time T7.

Figure 4:
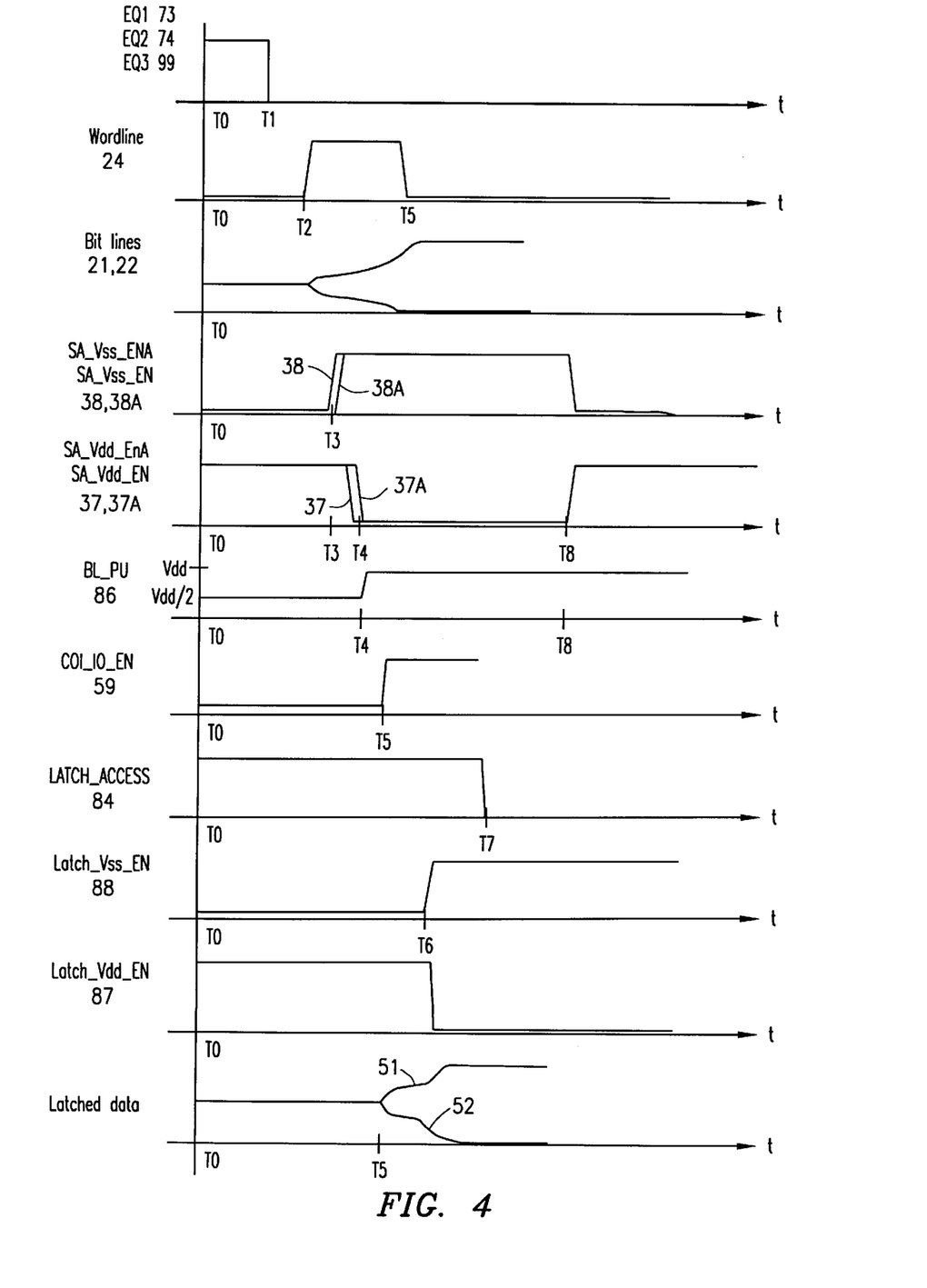
FIG. 4 is a timing diagram illustrating a full page read operation according to the present invention.

The operation of the present invention in reading data to the row 5 of latches 50 from an entire row of memory cells in memory array 2 during a single memory access cycle (i.e., a full page read operation) will be described with reference to the timing diagram of FIG. 4.

Because the reading of data from the memory cells in the selected row of memory cells is the same for each memory cell, the full page read operation will be described in terms of reading data from a single memory cell in the selected row of memory cells. In the example presented below, the row of memory cells associated with wordline 24 is the selected memory cell row from which a full page of data is to be read.

At time T0, bit lines 21 and 22, sense amplifier 30 and latch 50 are precharged and equilibrated by timing circuitry 80 driving control lines 73 (EQ1), 74 (EQ2) and 94 (EQ3) to Vdd. In addition, timing circuitry 80 drives control lines 59 (Col_IO_En) and 64 (SA_IO_En) to Vss to isolate bit lines 21 and 22 from column I/O lines 51 and 52, respectively. Timing circuitry 80 also decouples sense amplifier 30 and latch 50 from Vdd and Vss at time T0, by driving control lines 37 (SA_Vdd_En), 37A (SA_Vdd_EnA) and 87 (Latch_Vdd_En) to Vdd and control lines 38 (SA_Vss_En), 38A (SA_Vss_EnA) and 88 (Latch_Vss_En) to Vss. Control line 86 is also precharged to an intermediate voltage level at this time. The precharging and equilibrating are ceased at time T1. Shortly after time T1, word line 24 is driven to Vdd at time T2 which activates memory cell transistor 23A so that memory cell capacitor 23B shares its stored charge with bit line 21.

Next, sense amplifier 30 is powered up at time T3 by timing circuitry 80 driving control lines 38 (SA_Vss_En) and 38A (SA_Vss_EnA) to Vdd and control lines 37 (SA_Vdd_En) and 37A (SA_Vdd_EnA) to Vss shortly thereafter. In order to reduce the likelihood of generating noise within DRAM device 1, the driving of control lines 37 (SA_Vdd_En) and 37A (SA_Vdd_EnA) may be staggered in time, and the driving of control lines 38 (SA_Vss_En) and 38A (SA_Vss_EnA) may be staggered in time, as described above and illustrated in FIG. 4. Once connected to Vss and Vdd, sense amplifier 30 senses the charge differential appearing across bit lines 21 and 22 and drives bit lines 21 and 22 towards the appropriate reference voltage levels, Vss and Vdd. Timing circuitry 80 drives control line 86 (BL_PU) to Vdd at time T4 in order to enable one of pull-up devices 76 and 77 to facilitate one of bit lines 21 and 22 being fully driven to Vdd. At this point, the voltage levels appearing on bit lines 21 and 22 correspond to a full binary signal representing the data bit value stored in memory cell 23. Word line 24 being driven to Vss stores the restored data value in memory cell 23 and completes the refresh portion of the full page read operation.

At time T5, control line 59 (Col_IO_En) and/or 64 (SA_IO_En) is driven to Vdd in order to connect bit lines 21 and 22 to column I/O lines 51 and 52, respectively. This creates a charge differential between column I/O lines 51 and 52, which were previously equalized at time T0. At time T6, latch 50 is powered up by timing circuitry 80 driving control lines 87 (Latch_Vdd_En) and 88 (Latch_Vss_En) to Vss and Vdd, respectively. Once suitably connected to Vss and Vdd, latch 50 acts much like sense amplifier 30 in assuming the appropriate logic state and driving column I/O lines 51 and 52 to the full Vss/Vdd voltage levels based upon the charge/voltage differential initially appearing between column I/O lines 51 and 52. Thereafter, timing circuitry 80 drives control line 84 (Latch_Access, previously driven to Vdd) to Vss to isolate latch 50 from column I/O lines 51 and 52, thereby storing the data value read from memory cell 23 therein. The data, being thus stored in the row 5 of latches 50, may be read therefrom in blocks or segments of data. Following the storage of data in latches 50, sense amplifier 30 may be powered down by driving control lines 37 (SA_Vdd_En) and 37A (SA_Vdd_EnA) to Vdd and control lines 38 (SA_Vss_En) and 38A (SA_Vss_EnA) to Vss at time T8.

By utilizing a row 5 of latches 50 and sense amplifiers 3 as described above, the present invention allows a full row of data to be efficiently and effectively stored in a selected row of memory array 2 during a single memory cycle.

The above-described full page write operation writes data to an entire row of memory cells substantially faster than performing a number of write operations, each of which writes small amounts of data (bytes or words) to a portion of the memory cells in a row of memory cells at a time. Whereas in existing DRAM devices a read or refresh operation must be executed for the selected row of memory cells immediately prior to the writing of a smaller segment of data in order to preserve those the data in those memory cells which are not written with new data, in the present invention a full page write operation avoids the need for initially performing the read/refresh operation since all of the memory cells in the selected row are being written with new data. Because the sense amplifier elements 30 are not powered up until after the latch elements 50 have placed the data stored therein on their respective bit lines, the latch elements 50 do not overwrite/overpower the state of the sense amplifier elements 30, thereby conserving power.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for accessing a memory device having a plurality of memory cells arranged in a plurality of rows and columns, with each memory cell in a row being coupled to the same word line and each memory cell in a column being coupled to the same bit line, a plurality of sense amplifiers with each sense amplifier being coupled to a distinct pair of bit lines and a plurality of latches coupled to the bit lines, the method comprising the steps of:

decoupling the sense amplifiers from reference voltage sources which provide power to the sense amplifiers;

decoupling the latches from the reference voltage sources;

equalizing voltage levels appearing on the bit lines;

connecting an entire row of memory cells to the bit lines so as to create a charge differential between bit lines of each bit line pair;

coupling the sense amplifiers to the reference voltage sources which provide power thereto so that the sense amplifiers drive the bit lines towards reference voltage levels based upon a polarity of the charge differentials appearing across the bit lines of the bit line pairs;

coupling the latches to the bit lines;

coupling the latches to the reference voltage sources; and decoupling the latches from the bit lines.

2. The method of claim 1, wherein the step of coupling the sense amplifiers comprises the steps of:
coupling the sense amplifiers to a low reference voltage source; and
coupling the sense amplifiers to a high reference voltage source following the step of coupling the sense amplifiers to the low reference voltage source.

3. The method of claim 1, wherein the step of coupling the sense amplifiers comprises the steps of:
providing a first impedance between a low reference voltage source and the sense amplifiers so as to provide an electrical connection therebetween; and
providing a second impedance between the low reference voltage source and the sense amplifiers following the step of providing the first impedance, the second impedance being a lower impedance than the first impedance.

4. The method of claim 1, wherein the step of coupling the sense amplifiers comprises the steps of:
providing a first impedance between a high reference voltage source and the sense amplifiers so as to provide an electrical connection therebetween; and
providing a second impedance between the high reference voltage source and the sense amplifiers following the step of providing the first impedance, the second impedance being a lower impedance than the first impedance.

5. A random access memory device, comprising:
an array of memory cells arranged in a plurality of rows and columns of memory cells, including a plurality of word lines with memory cells in each row of memory cells being connected to a distinct word line and a plurality of bit lines with memory cells in each column of memory cells being connected to a distinct bit line;
a plurality of sense amplifiers, each sense amplifier being coupled to a distinct pair of bit lines and selectively enabled, during a memory read operation, to sense a charge differential appearing across a corresponding pair of bit lines and drive the corresponding pair of bit lines towards reference voltage levels based upon a Polarity of the charge differential;
a plurality of latch elements, each latch element being capable of storing data, coupled to a distinct pair of bit lines and selectively disconnected from at least one reference voltage source; and
control circuitry, operably connected to the memory cell array, the sense amplifiers and the latch elements, for transferring the data between each of the latch elements and an entire row of memory cells connected to a selected word line substantially concurrently, the control circuitry disconnects the latch elements from the at least one reference voltage source during a memory read operation until the sense amplifiers have drive the bit lines towards the reference voltage levels.

6. The random access memory device of claim 5, further including:
transmission gates connected between each bit line pair and a corresponding latch element, each transmission gate having a control terminal driven by the control circuitry, the control circuitry activating the transmission gates to connect the latch elements to the bit lines; and
equilibrate circuitry connected to each sense amplifier, the equilibrate circuitry being controlled by the control circuitry to short together nodes within each sense amplifier prior to the transmission gates being activated by the control circuitry.

7. The random access memory device of claim 5, wherein:
the latch elements are gated latch elements.

8. The random access memory device of claim of claim 5, wherein:
each latch element includes equilibrate circuitry, activated by the control circuitry, for selectively shorting together nodes within the latch element.

9. The random access memory device of claim 5, wherein each latch element comprises:
first transistors forming a pair of cross-coupled inverters;
a second transistor connected between a high reference voltage source and the first transistors and including a control signal driven by the control circuitry; and
a third transistor connected between a low reference voltage source and the first transistors and including a control signal driven by the control circuitry, the control circuitry turns off the second and third transistors during memory read operations until after the sense amplifiers are enabled.

10. A random access memory device, comprising:
an array of memory cells arranged in a plurality of rows and columns of memory cells, including a plurality of word lines with memory cells in each row of memory cells being connected to a distinct word line and a plurality of bit lines with memory cells in each column of memory cells being connected to a distinct bit line;
sense amplifiers, coupled to the bit lines, for sensing charge differentials appearing across bit line pairs during a memory read operation and driving the bit lines towards high and low reference voltage supply levels based upon a polarity of the charge differentials;
a plurality of load circuits, each load circuit being coupled to a distinct pair of bit lines and selectively disconnected from high and low reference voltage supplies each bit line pair being connected to a distinct load circuit; and
control circuitry, operably connected to the memory cell array, the sense amplifiers and the load circuits, for writing data provided by the load circuits into each memory cell connected to a selected word line substantially concurrently during the memory write operation, and placing data stored in a row of memory cells into the load circuits substantially concurrently during a memory read operation, the control circuitry disconnecting the load circuits from the high and low reference voltage supplies during the memory read operation prior to the sense amplifiers driving the bit lines and connecting the load circuits to the high and low reference voltage supplies during the memory read operation after the sense amplifiers commence driving the bit lines.

11. The random access memory device of claim 10, wherein:
each load circuit comprises latch element.

12. The random access memory device of claim 10, wherein:
each sense amplifier is connected to a distinct pair of bit lines bit lines and includes equilibrate circuitry for shorting nodes of the sense amplifier together prior to the data being provided from each memory cell of the selected row of memory cells to the bit lines, the equilibrate circuitry being controlled by the control circuitry.

13. The random access memory device of claim 10, further comprising:

power distribution circuitry for selectively disconnecting the low and high reference voltage supplies from the sense amplifiers for powering the sense amplifiers, the power distribution circuitry being controlled by the control circuitry to connect the sense amplifiers to the low and high reference voltage supplies following the data being provided from each memory cell of the selected row of memory cells to the bit lines.

14. The random access memory device of claim 10, wherein:

each load circuit comprises a latch; and the control circuitry selectively stores in the latches data previously stored in each memory cell connected to a selected word line substantially concurrently.

15. The random access memory device of claim 14, wherein:

each latch includes power supply circuitry activated by the control circuitry, for providing power to the latch following a selected row of memory cells being connected to the bit lines for storing data therefrom into the latches.

16. The random access memory device of claim 10, wherein each load circuit comprises:

first transistors forming a bistable storage element;

a second transistor connected between a high reference voltage source and the first transistors and including a control signal driven by the control circuitry; and a third transistor connected between a low reference voltage source and the first transistors and including a control signal driven by the control circuitry, the control circuitry turns off the second and third transistors during memory read operations until the sense amplifiers drive the bit lines.

17. A method for accessing a memory device having a plurality of memory cells arranged in a plurality of rows and columns, with each memory cell in a row being coupled to the same word line and each memory cell in a column being coupled to the same bit line, a plurality of column input/output lines, and a plurality of sense amplifiers and latches with each sense amplifier and latch being coupled to a distinct pair of bit lines, the method comprising the steps of:

decoupling the sense amplifiers from reference voltage sources which provide power to the sense amplifiers;

decoupling the latches from the reference voltage sources which provide power thereto;

equalizing voltage levels appearing on nodes within the sense amplifiers;

connecting an entire row of memory cells to the bit lines so that the charge appearing across each bit line pair corresponds to a binary data value stored in the memory cell connected thereto;

coupling the sense amplifiers to the reference voltage sources which provide power thereto so that the sense amplifiers drive the bit lines towards reference voltage levels based upon the binary data values appearing on the bit lines;

disconnecting the row of memory cells from the bit lines;

connecting a bit line from each bit line pair to a distinct column I/O line so that a voltage level appearing on each column I/O line represents the binary data value appearing on the bit line pair connected thereto;

connecting each latch to a distinct column I/O line; and coupling the latches to the reference voltage sources which provide power thereto so that the latches drive the column I/O lines towards reference voltage levels based upon the voltage level appearing on the column I/O lines; and accessing the latched data bit values in a sequential manner.

* * * * *